(12) United States Patent
Eker

(10) Patent No.: US 6,570,414 B1
(45) Date of Patent: May 27, 2003

(54) METHODS AND APPARATUS FOR REDUCING THE CROWBAR CURRENT IN A DRIVER CIRCUIT

(75) Inventor: Mehmet M. Eker, Santee, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/966,013

(22) Filed: Sep. 27, 2001

(51) Int. Cl.$^7$ ................................................. H03K 3/00
(52) U.S. Cl. .......................................... 327/108; 326/83
(58) Field of Search .............................. 327/108, 112, 327/284, 261; 326/83, 87, 86, 85, 93, 95, 104, 106; 365/233

(56) References Cited

U.S. PATENT DOCUMENTS

| | | | | |
|---|---|---|---|---|
| 5,723,992 A | * | 3/1998 | Yin et al. | 326/83 |
| 5,751,180 A | | 5/1998 | D'Addeo | 327/112 |
| 5,883,527 A | * | 3/1999 | Saito | 326/58 |
| 5,898,320 A | | 4/1999 | Li et al. | 326/58 |
| 5,929,694 A | * | 7/1999 | Yanagawa et al. | 326/87 |
| 5,963,047 A | * | 10/1999 | Kwong et al. | 326/27 |
| 5,990,705 A | * | 11/1999 | Lim | 326/58 |
| 6,057,717 A | * | 5/2000 | Kawano et al. | 326/87 |
| 6,100,727 A | * | 8/2000 | Nomura | 327/108 |
| 6,218,857 B1 | | 4/2001 | Sharpe-Geisler et al. | 326/86 |
| 6,236,237 B1 | | 5/2001 | Wong et al. | 326/83 |
| 6,281,706 B1 | * | 8/2001 | Wert et al. | 326/121 |
| 6,281,708 B1 | * | 8/2001 | Kenny | 326/24 |

* cited by examiner

*Primary Examiner*—Timothy P. Callahan
*Assistant Examiner*—Linh Nguyen
(74) *Attorney, Agent, or Firm*—Gray Cary Ware & Freidenrich; Terrance A. Meador

(57) ABSTRACT

A driver circuit which has a reduced or eliminated crowbar current includes a P-channel type transistor having a source coupled to a reference voltage; an N-channel type transistor having a source coupled to ground and a drain coupled to a drain of the P-channel type transistor; first logic gate circuitry (e.g., a NOR gate) having an input coupled to a reference clock signal and an output coupled to a gate of the P-channel type transistor; and second logic gate circuitry (e.g., a NAND gate) having an input coupled to the reference clock signal and an output coupled to a gate of the N-channel type transistor. The first logic gate circuitry is designed to have a first input voltage threshold value (e.g., ¼ $V_{DD}$) that is different from a second input voltage threshold value (e.g., ¾ $V_{DD}$) of the second logic gate circuitry. Thus, the output from the first logic gate circuitry provides off-to-on transitions which precede off-to-on transitions provided from the output of the second logic gate circuitry and on-to-off transitions which succeed on-to-off transitions provided by the second clock input signal.

17 Claims, 4 Drawing Sheets

METHODS AND APPARATUS FOR REDUCING THE CROWBAR CURRENT IN A DRIVER CIRCUIT

BACKGROUND OF THE INVENTION

1. Field of the Invention

The present invention relates generally to driver circuits, and more particularly to circuitry for reducing the crowbar current in high-speed driver circuits.

2. Description of the Related Art

Conventional high-speed driver circuits are wasteful due to the unnecessary power that is dissipated in driver transistors during signal transitions. To illustrate, FIG. 1 is a schematic diagram of a conventional driver circuit 100. Conventional driver circuit 100 is embodied in an integrated circuit (IC) 102 having an output pad 104 for coupling to a load, which is represented by a load capacitor 106 coupled to a ground 128. A reference clock signal 108 is coupled to an input of an inverter gate 110 which has an output coupled to gates of driver transistors 118 and 124. Driver transistor 118, which is a P-channel type Metal-Oxide-Semiconductor Field-Effect Transistor (MOSFET), has a source coupled to a reference voltage 126. Driver transistor 124, which is an N-channel type MOSFET, has a source coupled to ground 128.

An enable signal 112 is coupled to an input of an inverter gate 114 which has an output coupled to an input of an inverter gate 116. Inverter gate 116 has an output coupled to gates of transistors 120 and 122. Transistor 120 has a drain coupled to a drain of driver transistor 118, whereas transistor 122 has a source coupled to a drain of transistor 124. A source of transistor 120 is coupled to a drain of transistor 122, which forms an output to output pad 104.

When enable signal 112 is high, driver circuit 100 is enabled and transistors 120 and 122 are on. Reference clock signal 108 is inverted by inverter gate 110 and provided to driver transistors 118 and 124, turning them on and off at the same time. Since the gate inputs to driver transistors 118 and 124 are common, there is a direct current path from reference voltage 126 to ground 128 in the middle of each clock signal transition. This current flows through driver transistor 124 when charging load capacitor 106, and through driver transistor 118 when discharging load capacitor 106. This wasted current is commonly referred to as "crowbar current." The crowbar current not only increases the total power consumption of driver circuit 100, but contributes to the total peak current which may create layout and Simultaneous Switching Noise (SSN) problems.

FIG. 2 is a schematic diagram of another conventional driver circuit 200 which is configured to somewhat reduce the crowbar current. Conventional driver circuit 200 has an output pad 204 for coupling to a load, which is represented by a load capacitor 206 coupled to a ground 224. A reference clock signal 208 is coupled to a first input of a NAND gate 210 and to a first input of a NOR gate 216. An output of NAND gate 210 is coupled to a delay circuit 226, which has an output coupled to a gate of driver transistor 218. An output of NOR gate 216 is coupled to a gate of driver transistor 220. Driver transistor 218 is a P-channel type MOSFET which has a source coupled to a reference voltage 222. Driver transistor 220 is an N-type MOSFET which has a source coupled to ground 224 and a drain coupled to a drain of driver transistor 218. The latter connection forms an output coupled to output pad 204. An enable signal 208 is coupled to a second input of NAND gate 210 and to an input of an inverter gate 214 which has an output coupled to a second input of NOR gate 216.

When enable signal 212 is high, driver circuit 200 is enabled. A high voltage is maintained at the second input of NAND gate and a low voltage from the output of inverter gate 214 is maintained at the second input of NOR gate 216. Reference clock signal 208 is provided to driver transistors 218 and 220 through NAND and NOR gates 210 and 216, turning driver transistors 218 and 220 on and off at different times. Advantageously, delay circuit 226 delays the clock signal to driver transistor 218 so that the crowbar current is eliminated during off-to-on transitions at output pad 204. However, there is still a direct current path from reference voltage 222 to ground 224 during on-to-off transitions at output pad 204.

FIG. 3 is a schematic diagram of yet another conventional driver circuit 300 which is a variation of conventional driver circuit 200 of FIG. 2. Conventional driver circuit 300 is the same as conventional driver circuit 200 of FIG. 2, except that conventional driver circuit 300 has a delay circuit 302 in the path to the gate of driver transistor 220 but not in the path to the gate of driver transistor 218. Advantageously, delay circuit 302 delays the clock signal to driver transistor 220 so that the crowbar current is eliminated during on-to-off transitions at output pad 204. However, there is still a direct current path from reference voltage 222 to ground 224 during off-to-on transitions at output pad 204.

As described, even conventional driver circuits 200 and 300 configured to reduce the crowbar current reduce it on one edge only (rising or falling). Accordingly, there is a need for methods and apparatus to reduce or eliminate the crowbar current in driver circuits.

SUMMARY OF THE INVENTION

According to the present invention, a driver circuit includes a first driver transistor having a source coupled to a first reference voltage; a second driver transistor having a source coupled to a second reference voltage and a drain coupled to a drain of the first driver transistor; first logic gate circuitry having an input coupled to a reference clock signal and an output coupled to a gate of the first driver transistor; and second logic gate circuitry having an input coupled to the reference clock signal and an output coupled to a gate of the second driver transistor. The first logic gate circuitry produces a first clock input signal at its output and the second logic gate circuitry produces a second clock input signal at its output. The first clock input signal provides off-to-on transitions which precede off-to-on transitions provided by the second clock input signal and on-to-off transitions which succeed on-to-off transitions provided by the first clock input signal. Preferably, this signaling scheme is achieved by providing the first logic gate circuitry with a first input voltage threshold value that is sufficiently different from a second input voltage threshold value of the second logic gate circuitry. Advantageously, this prevents direct paths from the first reference voltage to the second reference voltage during both off-to-on and on-to-off transitions of the driver transistors.

DETAILED DESCRIPTION OF THE PREFERRED EMBODIMENTS

According to the present invention, a driver circuit includes a first driver transistor having a source coupled to a first reference voltage; a second driver transistor having a source coupled to a second reference voltage and a drain coupled to a drain of the first driver transistor; first logic gate circuitry having an input coupled to a reference clock signal and an output coupled to a gate of the first driver transistor; and second logic gate circuitry having an input coupled to the reference clock signal and an output coupled to a gate of the second driver transistor. The first logic gate circuitry produces a first clock input signal at its output and the second logic gate circuitry produces a second clock input signal at its output. The first clock input signal provides off-to-on transitions which precede off-to-on transitions provided by the second clock input signal and on-to-off transitions which succeed on-to-off transitions provided by the first clock input signal. Preferably, this signaling scheme is achieved by providing the first logic gate circuitry with a first input voltage threshold value that is less than a second input voltage threshold value of the second logic gate circuitry. Advantageously, this prevents direct paths from the first reference voltage to the second reference voltage during both off-to-on and on-to-off transitions.

In order to eliminate the crowbar current at both the rising and falling edges of the gate signal transitions, delaying the signal paths with respect to each other is not enough (see the discussion in the Background of the Invention). The discovery described herein is based on turning on the N-channel type driver transistor later in time, and off earlier in time, than the P-channel type driver transistor. The "on" duty cycle of the signal at the gate of the N-channel type driver transistor should be smaller than the "on" duty cycle of the signal at the gate of the P-channel type driver transistor. In addition, the "on" duty cycle of the signal at the gate of the N-type driver transistor should reside completely within the "on" duty cycle of the signal at the gate of the P-channel type driver transistor.

Figure 1:
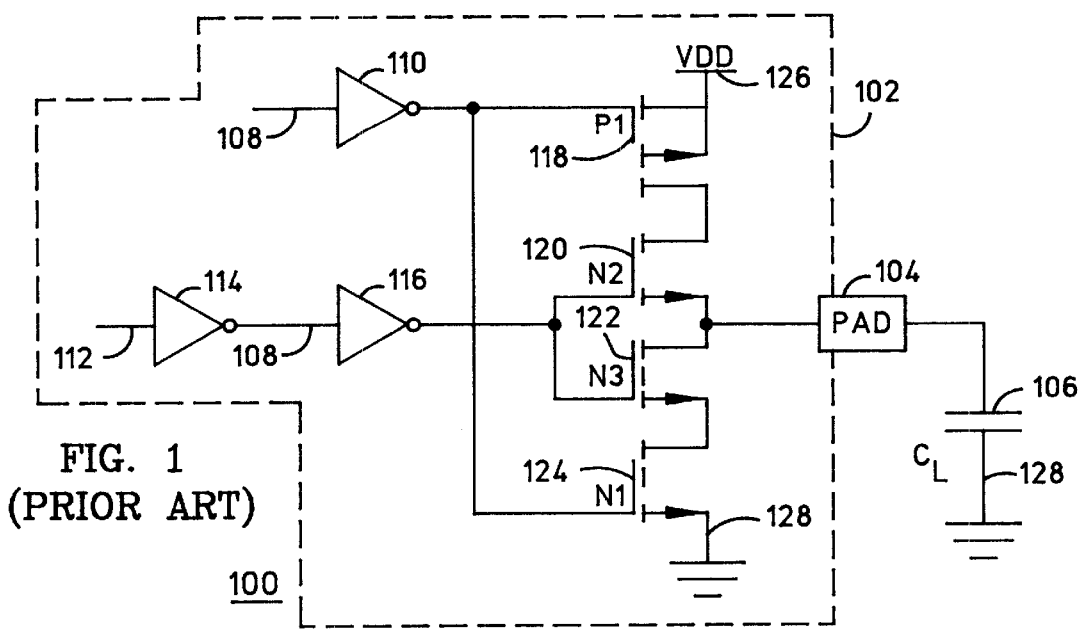
FIG. 1 is a schematic diagram of a conventional driver circuit.
Figure 2:
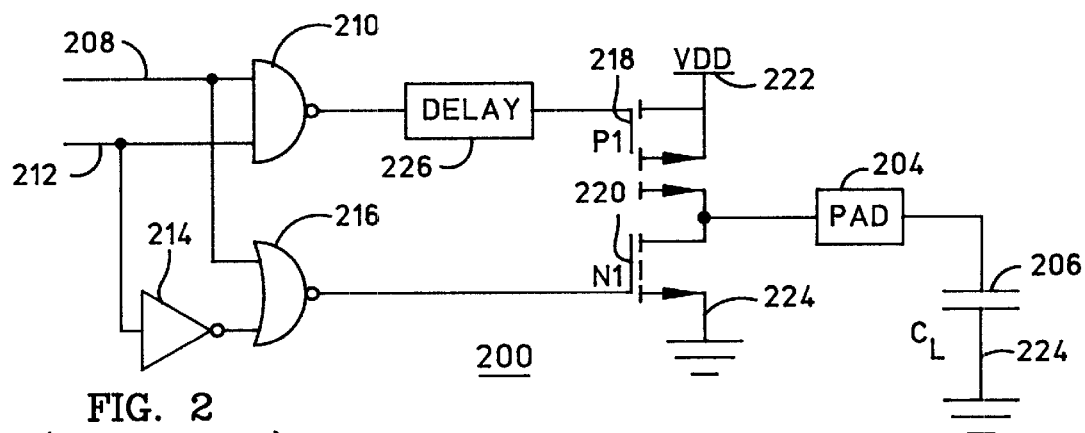
FIG. 2 is a schematic diagram of another conventional driver circuit.
Figure 3:
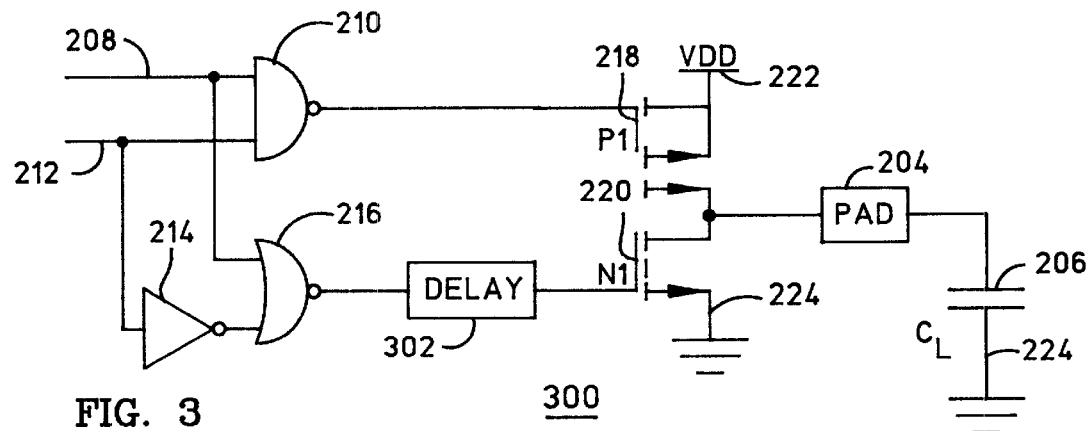
FIG. 3 is a schematic diagram of yet another conventional driver circuit.
Figure 4:
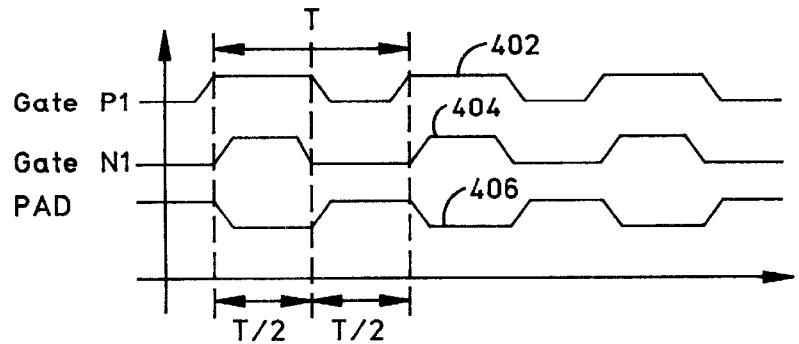
FIG. 4 is an illustration of a signal transition timing scheme employed by the present invention.

To illustrate, FIG. 4 shows a signal transition timing scheme employed by the present invention. A clock input signal 402 is input to a P-channel type driver transistor, and a clock input signal 404 is input to an N-type driver transistor. As illustrated, clock input signal 402 provides off-to-on transitions that always precede off-to-on transitions provided by clock input signal 404. In addition, clock input signal 402 provides on-to-off transitions that always succeed on-to-off transitions provided by clock input signal 404. Therefore, the driver transistors are (ideally) never on at the same time which thereby eliminates (or at least reduces) the crowbar current. A resulting driver output signal 406 from utilizing clock input signals 402 and 404 is also shown in FIG. 4. Advantageously, this driver output signal 406 maintains a 50% duty cycle.

Figure 5:
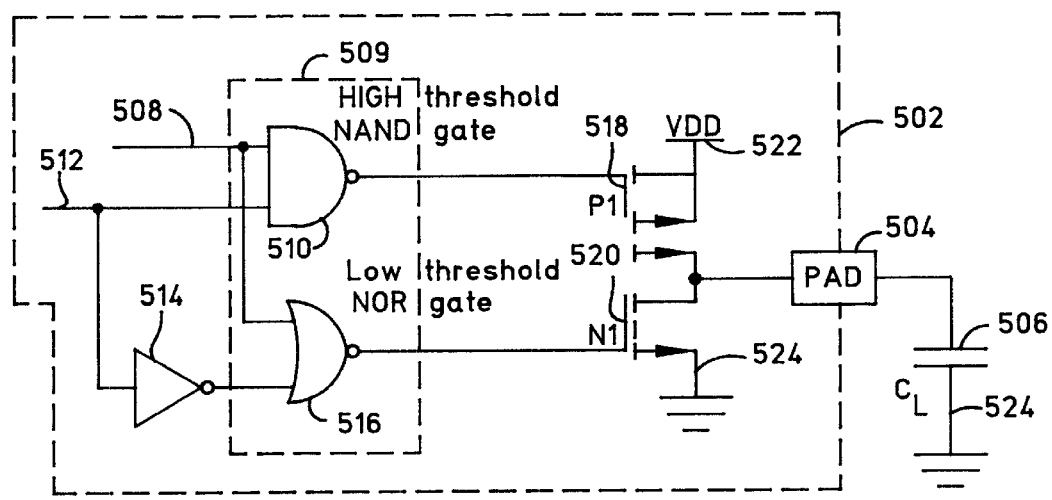
FIG. 5 is a schematic diagram of a driver circuit of a first embodiment of the present invention.

FIG. 5 is a schematic diagram of a driver circuit 500 of a first embodiment of the present invention. Driver circuit 500 is embodied in an integrated circuit (IC) 502 having an output pad 504 for coupling to a load, which is represented by a load capacitor 506 coupled to a ground 524. A reference clock signal 508 is coupled to a first input of a NAND gate 510 and to a first input of a NOR gate 516. An output of NAND gate 510 is coupled to a gate of a driver transistor 518. An output of NOR gate 516 is coupled to a gate of a driver transistor 520. Driver transistor 518 is a P-channel type MOSFET which has a source coupled to a reference voltage 522, $V_{DD}$. Driver transistor 520 is an N-channel type MOSFET which has a source coupled to ground 524 and a drain coupled to a drain of driver transistor 518. The latter connection forms an output coupled to output pad 504.

An enable signal 508 is coupled to a second input of NAND gate 510 and to an input of an inverter gate 514 which has an output coupled to a second input of NOR gate 516. When enable signal 512 is high, driver circuit 500 is enabled. A high voltage is maintained at the second input of NAND gate 510, and a low voltage from the output of inverter gate 514 is maintained at the second input of NOR gate 516. Reference clock signal 508 is provided to driver transistors 518 and 520 through NAND and NOR gates 510 and 516, turning driver transistors 518 and 520 on and off at different times.

NAND gate 510 is designed to have a high input voltage threshold value (i.e., greater than $V_{DD}/2$). On the other hand, NOR gate 516 is designed to have a low input voltage threshold value (i.e., less than $V_{DD}/2$). In any case, the input voltage threshold value of NAND gate 510 is greater than the input voltage threshold value of NOR gate 516. The exact values of the thresholds depend on the specific design and may differ from process to process. In this particular embodiment, the input voltage threshold value of NAND gate 510 is set at about ¾ of the value of $V_{DD}$ (or ¾ of the difference between a first reference voltage, $V_{DD}$, and a second reference voltage, ground 524); and the input voltage threshold value of NOR gate 516 is set at about ¼ of the value of $V_{DD}$ (or ¼ of the difference between the first reference voltage, $V_{DD}$, and the second reference voltage, ground 524).

Figure 6:
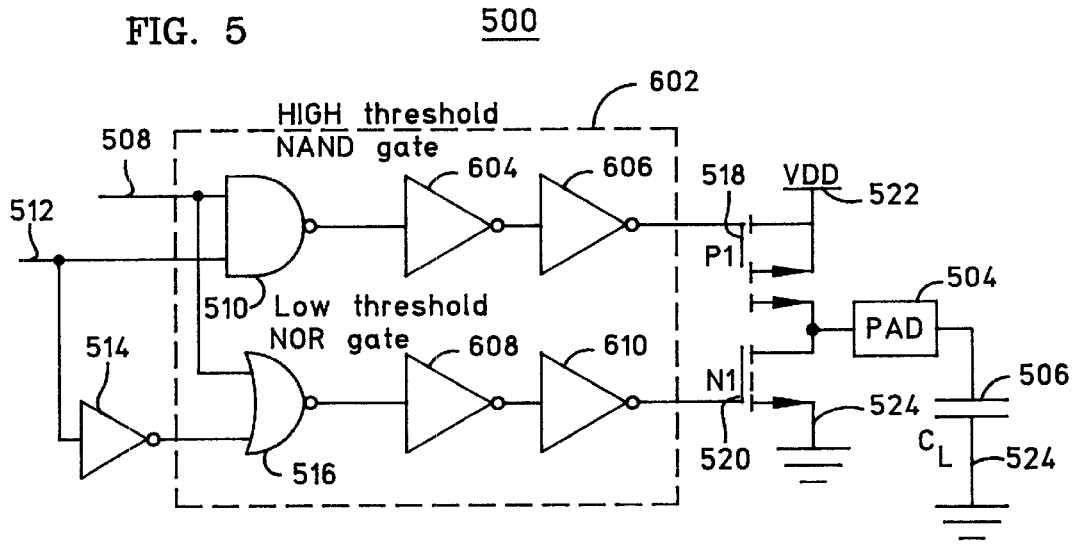
FIG. 6 is a schematic diagram of a driver circuit of a second embodiment of the present invention.

NAND gate 510 and NOR gate 516 form logic gate circuitry 509 of the present invention. However, other logic gate circuitry may be utilized to achieve the results of the present invention as one skilled in the art will readily appreciate. For example, driver transistors 518 and 520 may be large and required to drive big loads. If very large, driver transistors 518 and 520 might need to be driven with more than just NAND and NOR gates 510 and 516. To handle this, FIG. 6 illustrates a schematic diagram of driver circuit 500 of a second embodiment of the present invention. Driver circuit 500 of FIG. 6 is the same as driver circuit 500 of FIG. 5, except that driver circuit 500 of FIG. 6 has different logic gate circuitry 602.

In addition to having NAND and NOR gates 510 and 516, logic gate circuitry 602 of FIG. 6 includes an inverter gate 604, an inverter gate 606, an inverter gate 608, and an inverter gate 610. The output of NAND gate 510 is coupled to an input of inverter gate 604, which has an output coupled to an input of inverter gate 606, which has an output coupled to the gate of driver transistor 518. Similarly, the output of NOR gate 516 is coupled to an input of inverter gate 608, which has an output coupled to an input of inverter gate 610, which has an output coupled to the gate of driver transistor 620. Thus, the output of NAND and NOR gates 510 and 516 are buffered by additional inverter gates to drive bigger loads.

The combination of NAND, inverter, and inverter gates 510, 604, and 606 can be used to obtain an overall high threshold value for the input to driver transistor 518. Likewise, the combination of NOR, inverter, and inverter gates 516, 608, and 610 can be used to obtain an overall low threshold value for the input to driver transistor 520. The number of inverter gates used after NAND and NOR gates 510 and 516 should be even for this configuration, and is limited by the maximum allowable propagation delay of the design.

Figure 7:
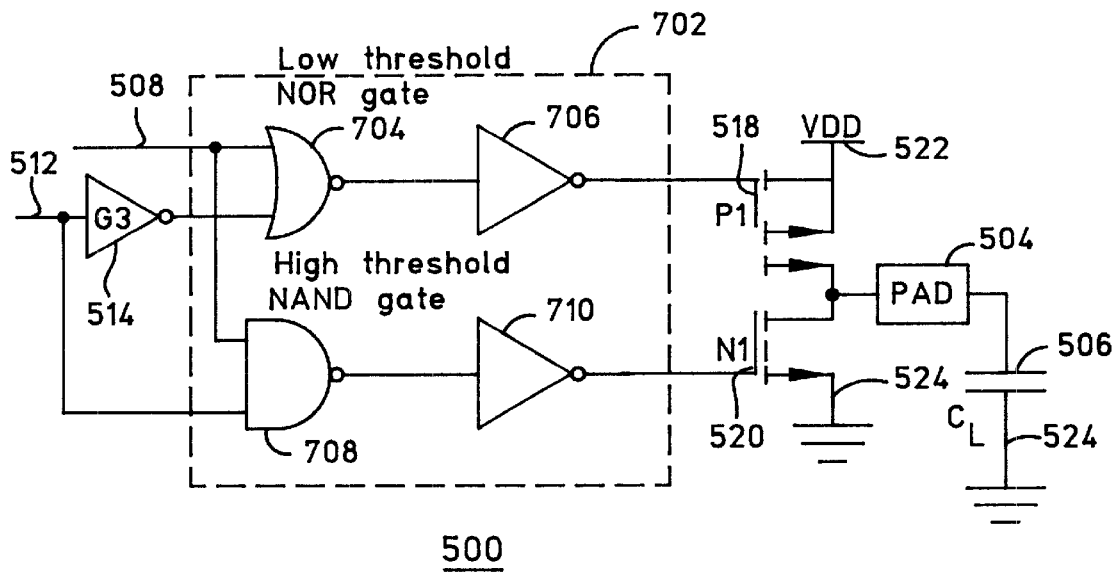
FIG. 7 is a schematic diagram of a driver circuit of a third embodiment of the present invention.

The propagation delay of driver circuit 500 of FIG. 6 may be required to be small. To handle this, FIG. 7 illustrates a schematic diagram of driver circuit 500 of a third embodiment of the present invention. Driver circuit 500 of FIG. 7 is the same as driver circuit 500 of FIG. 5, except that driver circuit 500 of FIG. 7 has different logic gate circuitry 702. Logic gate circuitry 702 of FIG. 7 includes a NOR gate 704 having a first input coupled to reference clock signal 508, a second input coupled to the output of inverter gate 514, and an output coupled to an input of an inverter gate 706. The output of inverter gate 706 is coupled to the gate of driver transistor 518. Logic gate circuitry 702 also includes a NAND gate 708 having a first input coupled to reference clock signal 508, a second input coupled to enable signal 512, and an output coupled to an input of an inverter gate 710. The output of inverter gate 710 is coupled to the gate of driver transistor 520. Here, the clock input to driver circuit 500 of FIG. 7 has to be inverted in order to get a non-inverted signal at output pad 504. Such an inverted input is typically available in the core section of an IC without having the added propagation delay expense of an additional inverter gate.

NOR gate 704 is designed to have a low input voltage threshold value (i.e., less than $V_{DD}/2$). On the other hand, NAND gate 708 is designed to have a high input voltage threshold value (i.e., greater than $V_{DD}/2$). In any case, the input voltage threshold value of NOR gate 704 is less than the input voltage threshold value of NAND gate 708. The exact values of the thresholds depend on the specific design and may differ from process to process. In this particular embodiment, the input voltage threshold value of NOR gate 510 is set at about ¼ of the value of $V_{DD}$ (or ¼ of the difference between a first reference voltage, $V_{DD}$, and a second reference voltage, ground 524); and the input voltage threshold value of NAND gate 708 is set at about ¾ of the value of $V_{DD}$ (or ¾ of the difference between the first reference voltage, $V_{DD}$, and the second reference voltage, ground 524).

Figure 8:
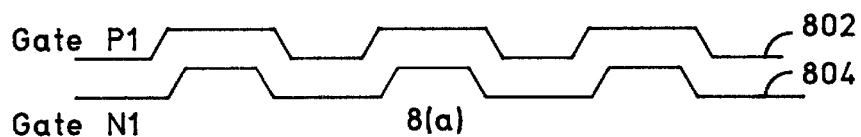
FIG. 8 is an illustration of possible signal transitions of driver circuits.
Figure 8:
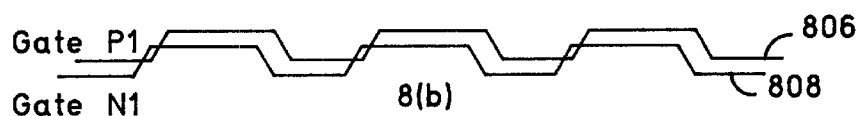
Figure 8:
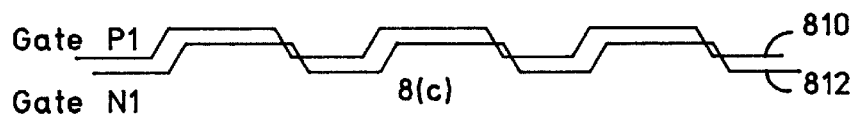

In practice, the alignment of the input clock signals into the gates of the driver transistors may not be perfect. FIG. 8 illustrates possible input clock signals into the driver transistors. More particularly, FIG. 8A illustrates ideal input clock signals; FIG. 8B illustrates input clock signals having a first alignment error; and FIG. 8C illustrates input clock signals having a second alignment error.

Figure 9:
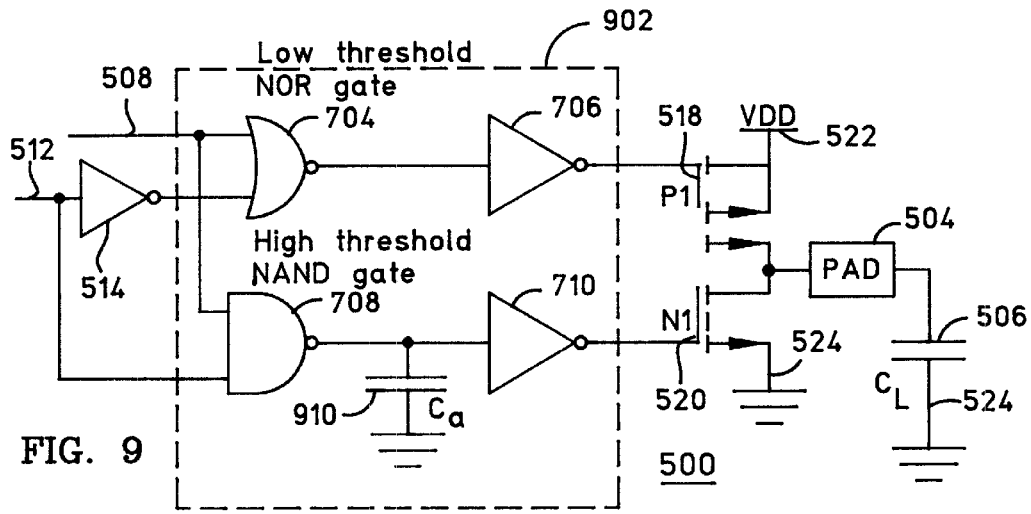
FIG. 9 is a schematic diagram of a driver circuit of a fourth embodiment of the present invention.

To handle the first alignment error of FIG. 8B, FIG. 9 illustrates a schematic diagram of driver circuit 500 of a fourth embodiment of the present invention. Driver circuit 500 of FIG. 9 is the same as driver circuit 500 of FIG. 7, except that driver circuit 500 of FIG. 9 has different logic gate circuitry 902. Namely, logic gate circuitry 902 of FIG. 9 includes an additional capacitor 910 coupled at the output of NAND gate 708 and to ground 524. Given a suitable capacitance, capacitor 910 will sufficiently delay the input clock signal into driver transistor 520 so as to center the signals appropriately as shown in FIG. 8A.

Figure 10:
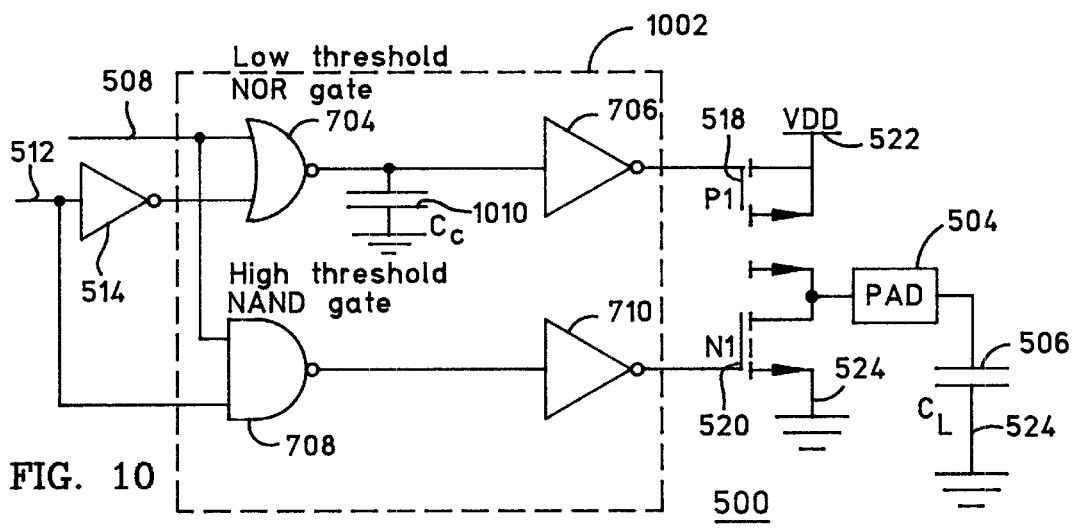
FIG. 10 is a schematic diagram of a driver circuit of a fifth embodiment of the present invention.

To handle the second alignment error of FIG. 8C, FIG. 10 illustrates a schematic diagram of driver circuit 500 of a fifth embodiment of the present invention. Driver circuit 500 of FIG. 10 is the same as driver circuit 500 of FIG. 7, except that driver circuit 500 of FIG. 10 has different logic gate circuitry 1002. Namely, logic gate circuitry 1002 of FIG. 10 includes an additional capacitor 1010 coupled at the output of NOR gate 704 and to ground 524. Given a suitable capacitance, capacitor 1010 will sufficiently delay the input clock signal into driver transistor 518 so as to center the signals appropriately as shown in FIG. 8A. As one skilled in the art will readily appreciate, such alignment errors can be corrected for other circuits as well, such as driver circuit 500 of FIG. 6.

As described herein, an inventive driver circuit includes a first driver transistor having a source coupled to a first reference voltage; a second driver transistor having a source coupled to a second reference voltage and a drain coupled to a drain of the first driver transistor; first logic gate circuitry having an input coupled to a reference clock signal and an output coupled to a gate of the first driver transistor; and second logic gate circuitry having an input coupled to the reference clock signal and an output coupled to a gate of the second driver transistor. The first logic gate circuitry produces a first clock input signal at its output and the second logic gate circuitry produces a second clock input signal at its output. The first clock input signal provides off-to-on transitions which precede off-to-on transitions provided by the second clock input signal and on-to-off transitions which succeed on-to-off transitions provided by the first clock input signal. Preferably, this signaling scheme is achieved by providing the first logic gate circuitry with a first input voltage threshold value that is sufficiently different from a second input voltage threshold value of the second logic gate circuitry. Advantageously, this prevents direct paths from the first reference voltage to the second reference voltage during both off-to-on and on-to-off transitions.

An inventive method of generating clock input signals to transistors of a driver circuit includes the acts of producing, from a reference clock signal, a first clock input signal at a gate of a first transistor of the driver circuit; and producing, from the reference clock signal, a second clock input signal at a gate of the second transistor of the driver circuit. The second clock input signal provides off-to-on transitions which succeed off-to-on transitions provided by the first clock input signal, and on-to-off transitions which precede on-to-off transitions provided by the first clock input signal.

Thus, the present invention eliminates or at least reduces the crowbar current in driver circuits. The same output load can now be driven with lower power at the same or better efficiency. Also, sharper edges and higher speeds at the driver output can be achieved with little concern for Simultaneously Switching Noise (SSN). A reduced total peak current allows for a more compact layout of driver circuits, thereby providing a great savings in IC "real estate."

It is to be understood that the above is merely a description of preferred embodiments of the invention and that various changes, alterations, and variations may be made without departing from the true spirit and scope of the invention as set for in the appended claims. None of the

What is claimed is:

1. A driver circuit, comprising:

a first driver transistor having a source coupled to a first reference voltage;

a second driver transistor having a source coupled to a second reference voltage, and a drain coupled to a drain of the first driver transistor which comprises an output of the driver circuit;

first logic sate circuitry having an input coupled to a reference clock signal and an output coupled to a gate of the first driver transistor, the first logic gate circuitry producing a first clock input signal at its output; and second logic gate circuitry having an input coupled to the reference clock signal and an output coupled to a gate of the second driver transistor, the second logic gate circuitry producing a second clock input signal at its output, the second clock input signal providing off-to-on transitions which succeed off-to-on transitions provided by the first clock input signal and on-to-off transitions which precede on-to-off transitions provided by the first clock input signal, wherein;

the first logic gate circuitry has a first input voltage threshold value and the second logic gate circuitry has a second input voltage threshold value that is different from the first input voltage threshold value.

2. A driver circuit, comprising:

a first driver transistor having a source coupled to a first reference voltage;

a second driver transistor having a source coupled to a second reference voltage, and a drain coupled to a drain of the first driver transistor which comprises an output of the driver circuit;

first logic gate circuitry having an input coupled to a reference clock signal and an output coupled to a gate of the first driver transistor, the first logic gate circuitry producing a first clock input signal at its output; and second logic gate circuitry having an input coupled to the reference clock signal and an output coupled to a gate of the second driver transistor, the second logic gate circuitry producing a second clock input signal at its output, the second clock input signal providing off-to-on transitions which succeed off-to-on transitions provided by the first clock input signal and on-to-off transitions which precede on-to-off transitions provided by the first clock input signal; wherein;

the first logic gate circuitry has a first input voltage threshold value that is greater than ½ of the difference between the first and the second reference voltages, and the second logic gate circuitry has a second input voltage threshold value that is less than ½ of the difference between the first and the second reference voltages.

3. The driver circuit of claim 2, wherein the first logic gate circuitry comprises a NAND gate circuit and the second logic gate circuitry comprises a NOR gate circuit.

4. A driver circuit, comprising:

a first driver transistor having a source coupled to a first reference voltage;

a second driver transistor having a source coupled to a second reference voltage, and a drain coupled to a drain of the first driver transistor which comprises an output of the driver circuit;

first logic gate circuitry having an input coupled to a reference clock signal and an output coupled to a gate of the first driver transistor, the first logic gate circuitry producing a first clock input signal at its output; and second logic sate circuitry having an input coupled to the reference clock signal and an output coupled to a gate of the second driver transistor, the second logic gate circuitry producing a second clock input signal at its output, the second clock input signal providing off-to-on transitions which succeed off-to-on transitions provided by the first clock input signal and on-to-off transitions which precede on-to-off transitions provided by the first clock input signal; wherein;

the first logic gate circuitry has a first input voltage threshold value that is less than ½ of the difference between the first and the second reference voltages, and the second logic gate circuitry has a second input voltage threshold value that is greater than ½ of the difference between the first and the second reference voltages.

5. The driver circuit of claim 4, wherein the first logic gate circuitry comprises a NOR gate circuit and the second logic gate circuitry comprises a NAND gate circuit.

6. The driver circuit of claim 1, wherein the first driver transistor comprises a P-channel type transistor and the second driver transistor comprises an N-channel type transistor.

7. A driver circuit, comprising:

a P-channel type transistor having a source coupled to a first reference voltage;

an N-channel type transistor having a source coupled to a second reference voltage that is less than the first reference voltage, and a drain coupled to a drain of the P-channel type transistor which comprises an output of the driver circuit;

first logic gate circuitry having an input coupled to a reference clock signal and an output coupled to a gate of the P-channel type transistor;

second logic gate circuitry having an input coupled to the reference clock signal and an output coupled to a gate of the N-type transistor; and the first logic gate circuitry having a first input voltage threshold value that is different from a second input voltage threshold value of the second logic gate circuitry; wherein the first logic gate circuitry is operative to produce a first clock input signal at its output and the second logic gate circuitry is operative to produce a second clock input signal at its output, the first clock input signal providing off-to-on transitions which precede off-to-on transitions provided by the second clock input signal and on-to-off transitions which succeed on-to-off transitions provided by the second clock input signal.

8. The driver circuit of claim 7, wherein the first input voltage threshold value is less than ½ of the difference between the first and the second reference voltages and the second input voltage threshold value is greater than ½ of the difference between the first and the second reference voltages.

9. The driver circuit of claim 7, wherein the first input voltage threshold value is greater than ½ of the difference between the first and the second reference voltages and the second input voltage threshold value is less than ½ of the difference between the first and the second reference voltages.

10. The driver circuit of claim 7, wherein the first input voltage threshold value is about ¼ of the difference between the first and the second reference voltages and the second input voltage threshold value is about ¾ of the difference between the first and the second reference voltages.

11. The driver circuit of claim 7, wherein the first input voltage threshold value is about ¾ of the difference between the first and the second reference voltages and the second input voltage threshold value is about ¼ of the difference between the first and the second reference voltages.

12. The driver circuit of claim 7, wherein the first logic gate circuitry comprises a NAND gate circuit and has the first input voltage threshold value which is about ¾ of the difference between the first and the second reference voltages, and the second logic gate circuitry comprises a NOR gate circuit and has the second input voltage threshold value which is about ¼ of the difference between the first and the second reference voltages.

13. The driver circuit of claim 7, wherein the first logic gate circuitry comprises a NOR gate circuit and has the first input voltage threshold value which is about ¼ of the difference between the first and the second reference voltages, and the second logic gate circuitry comprises a NAND gate circuit and has the second input voltage threshold value which is about ¾ of the difference between the first and the second reference voltages.

14. A method of generating clock input signals to transistors of a driver circuit, the method comprising:

produce, from a reference clock signal, a first clock input signal at a gate of a first transistor of the driver circuit; and producing, from the reference clock signal, a second clock input signal at the gate of a second transistor of the driver circuit, the second clock input signal providing off-to-on transitions which succeed off-to-on transitions provided by the first clock input signal and on-to-off transitions which precede on-to-off transitions provided by the first clock input signal; wherein;

the act of producing the first clock input signal comprises producing the first clock input signal at a gate of a first transistor comprising a P-channel type transistor and the act of producing the second clock input signal comprises producing the second clock input signal at a gate of a second transistor comprising an N-channel type transistor.

15. The method of claim 14, wherein the act of producing the first clock input signal comprises producing the first clock input signal with first logic gate circuitry which has an input coupled to the reference clock signal, and the act of producing the second clock input signal comprises producing the second clock input signal with second logic gate circuitry which has an input coupled to the reference clock signal, the first logic gate circuitry having a first input voltage threshold value that is sufficiently different from a second input voltage threshold value of the second logic gate circuitry.

16. The method of claim 15, wherein the act of producing the first clock input signal comprises producing the first clock input signal from an output of a NAND gate circuit and the act of producing the second clock input signal comprises producing the second clock input signal from an output of a NOR gate circuit.

17. The method of claim 15, wherein the act of producing the first clock input signal comprises producing the first clock input signal from an output of a NOR gate circuit and the act of producing the second clock input signal comprises producing the second clock input signal from an output of a NAND gate circuit.

* * * * *